US011770980B2

(12) United States Patent
Lee et al.

(10) Patent No.: US 11,770,980 B2
(45) Date of Patent: Sep. 26, 2023

(54) ELECTRONIC DEVICE

(71) Applicant: SK hynix Inc., Icheon-si (KR)

(72) Inventors: Tae Young Lee, Icheon-si (KR); Guk Cheon Kim, Icheon-si (KR); Soo Gil Kim, Icheon-si (KR); Min Seok Moon, Icheon-si (KR); Jong Koo Lim, Icheon-si (KR); Sung Woong Chung, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 365 days.

(21) Appl. No.: 16/991,645

(22) Filed: Aug. 12, 2020

(65) Prior Publication Data
US 2021/0184101 A1   Jun. 17, 2021

(30) Foreign Application Priority Data
Dec. 13, 2019   (KR) .................. 10-2019-0166562

(51) Int. Cl.
*H10N 50/80* (2023.01)
*H10B 61/00* (2023.01)
*H10N 50/01* (2023.01)
*H10N 50/85* (2023.01)

(52) U.S. Cl.
CPC ............. *H10N 50/80* (2023.02); *H10B 61/00* (2023.02); *H10N 50/01* (2023.02); *H10N 50/85* (2023.02)

(58) Field of Classification Search
CPC ......... H01L 43/02; H01L 43/10; H01L 43/12; H01L 27/222; H01N 50/80; H01N 50/01; H01N 50/85; H01N 61/00
See application file for complete search history.

(56) References Cited

U.S. PATENT DOCUMENTS

2019/0173001 A1* 6/2019 Lee .................. G11C 11/161
2020/0313084 A1* 10/2020 Ouellette .............. H10N 50/01
2022/0238799 A1* 7/2022 Guo .................... H01L 43/02

FOREIGN PATENT DOCUMENTS

KR   10-2015-0066858 A   6/2015
KR   10-2018-0049339 A   5/2018

* cited by examiner

*Primary Examiner* — Marc Anthony Armand
(74) *Attorney, Agent, or Firm* — Perkins Coie LLP

(57) ABSTRACT

An electronic device may include a semiconductor memory, and the semiconductor memory may include a multilayer synthetic anti-ferromagnetic (Multi SAF) structure including a first ferromagnetic layer, a second ferromagnetic layer, and a spacer layer interposed between the first ferromagnetic layer and the second ferromagnetic layer, wherein the spacer layer may include n non-magnetic layers and n−1 magnetic layers that are disposed such that each of the n non-magnetic layers and each of the n−1 magnetic layers are alternately stacked, wherein n indicates an odd number equal to or greater than 3, wherein the n−1 magnetic layers and n non-magnetic layers may be configured to effectuate an antiferromagnetic exchange coupling with at least one of the first ferromagnetic layer and the second ferromagnetic layer.

20 Claims, 14 Drawing Sheets

ELECTRONIC DEVICE

CROSS-REFERENCE TO RELATED APPLICATION

This patent document claims priority of Korean Patent Application No. 10-2019-0166562, entitled "ELECTRONIC DEVICE" and filed on Dec. 13, 2019, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory which can improve characteristics of a variable resistance element that exhibits different resistance states for storing data.

In one aspect, an electronic device comprising a semiconductor memory is provided. The semiconductor memory includes: a multilayer synthetic anti-ferromagnetic structure including a first ferromagnetic layer; a second ferromagnetic layer; and a multicomposite layer interposed between the first ferromagnetic layer and the second ferromagnetic layer, wherein the multicomposite layer includes n functional layers and n−1 magnetic layers which are alternately stacked, and n indicates an odd number of 3 or more, wherein the first ferromagnetic layer, the second ferromagnetic layer and the n−1 magnetic layers form an antiferromagnetic exchange coupling through the n functional layers.

In another aspect, an electronic device may include a semiconductor memory, and the semiconductor memory may include a multilayer synthetic anti-ferromagnetic structure including a first ferromagnetic layer, a second ferromagnetic layer, and a spacer layer interposed between the first ferromagnetic layer and the second ferromagnetic layer, wherein the spacer layer may include n non-magnetic layers and n−1 magnetic layers that are disposed such that each of the n non-magnetic layers and each of the n−1 magnetic layers are alternately stacked, wherein n indicates an odd number equal to or greater than 3, wherein the n−1 magnetic layers and n non-magnetic layers may be configured to effectuate an antiferromagnetic exchange coupling with at least one of the first ferromagnetic layer and the second ferromagnetic layer.

In another aspect, an electronic device may include a semiconductor memory, and the semiconductor memory may include: a magnetic tunnel junction structure including a free layer, a pinned layer, and a tunnel barrier layer, the free layer having a variable magnetization direction, the pinned layer having a fixed magnetization direction, the tunnel barrier layer being interposed between the free layer and the pinned layer: and an intermediate layer interposed between the tunnel barrier layer and the pinned layer, wherein any one or more of the free layer and the pinned layer may include a multilayer synthetic anti-ferromagnetic structure including a spacer layer, wherein the spacer layer may include n non-magnetic layers and n−1 magnetic layers that are alternately stacked, wherein n indicates an odd number equal to or greater than 3, wherein the non-magnetic layers and the magnetic layers may have an fcc (111) structure, and the intermediate layer may have a bcc (001) structure.

These and other aspects, implementations and associated advantages are described in greater detail in the drawings, the description and the claims.

DETAILED DESCRIPTION

Figure 1:
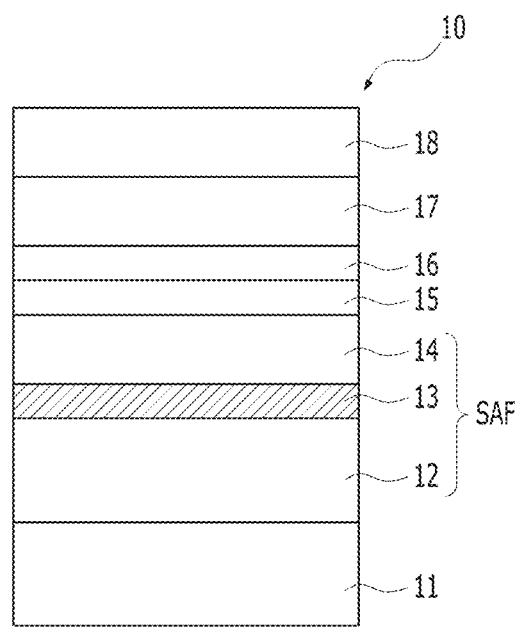
FIG. 1 is a cross-sectional view illustrating an example of a variable resistance element.

Various examples and implementations of the disclosed technology are described below in detail with reference to the accompanying drawings.

The drawings may not be necessarily to scale and in some instances, proportions of at least some of substrates in the drawings may have been exaggerated to illustrate certain features of the described examples or implementations. In presenting a specific example in a drawing or description having two or more layers in a multi-layer substrate, the relative positioning relationship of such layers or the sequence of arranging the layers as shown reflects a particular implementation for the described or illustrated example and a different relative positioning relationship or sequence of arranging the layers may be possible.

FIG. 1 is a cross-sectional view illustrating an example of a variable resistance element.

Referring to FIG. 1, an example of a variable resistance element 10 may include a Magnetic Tunnel Junction (MTJ) structure including a free layer 17 having a variable magnetization direction, a pinned layer 14 having a fixed magnetization direction and a tunnel barrier layer 16 interposed between the free layer 17 and the pinned layer 14.

The free layer 17 may have a variable magnetization direction that causes the MTJ structure to have a variable resistance value. The free layer 17 may also be referred as a storage layer.

The pinned layer 14 may have a pinned magnetization direction, which remains unchanged while the magnetization direction of the free layer 17 changes. For this reason, the pinned layer 14 may be referred to as a reference layer.

Depending on a voltage or current applied to the variable resistance element 10, the magnetization direction of the free layer 17 may be changed by spin torque transfer. When the magnetization directions of the free layer 17 and the pinned layer 14 are parallel to each other, the variable resistance element 10 may be in a low resistance state, and this may indicate a digital data bit "0." Conversely, when the magnetization directions of the free layer 17 and the pinned layer 14 are anti-parallel to each other, the variable resistance element 10 may be in a high resistance state, and this may indicate a digital data bit "1." That is, the variable resistance element 10 may function as a memory cell to store a digital data bit based on the orientation of the free layer 17.

The free layer 17 and the pinned layer 14 may have a single-layer or multilayer structure including a ferromagnetic material. The magnetization direction or polarity of the free layer 17 may be changed or flipped between a downward direction and an upward direction. The magnetization direction of the pinned layer 14 may be fixed in a downward direction.

The tunnel barrier layer 16 may allow the tunneling of electrons to change the magnetization direction of the free layer 17. The tunnel barrier layer 16 may include a dielectric oxide.

The variable resistance element 10 may further include a shift canceling layer 12 and a spacer layer 13.

The shift canceling layer 12 may serve to offset or reduce the effect of the stray magnetic field produced by the pinned layer 14. The shift canceling layer 12 may have a magnetization direction which is anti-parallel to a magnetization direction of the pinned layer 14. The shift canceling layer 12 may have a single-layer or multilayer structure including a ferromagnetic material.

The spacer layer 13 may be interposed between the pinned layer 14 and the shift canceling layer 12 and provide an antiferromagnetic exchange coupling therebetween.

That is, the pinned layer 14 and the shift canceling layer 12 form an antiferromagnetic exchange coupling with each other through the spacer layer 13 to form a synthetic anti-ferromagnetic structure (SAF).

The variable resistance element 10 may further include one or more layers performing various functions to improve a characteristic of the MTJ structure. For example, the variable resistance element 10 may further include an under layer 11 disposed below the MTJ structure, an intermediate layer 15 interposed between the tunnel barrier layer 16 and the pinned layer 14 and an upper layer 18 disposed over the MTJ structure.

In order to maintain a strong antiferromagnetic exchange coupling between the pinned layer 14 and the shift canceling layer 12 forming the SAF structure, characteristics of the spacer layer 13 should be sufficiently secured. In the variable resistance element 10, the spacer layer 13 may have a single-layer structure including a conductive material such as Ru. However, the spacer layer 13 having a single-layer structure is very vulnerable to process damage such as IBE damage, and thus has a problem of rapid deterioration during scaling down. Therefore, the antiferromagnetic exchange coupling between the pinned layer 14 and the shift canceling layer 12 is weakened due to deterioration of characteristics of the spacer layer 13, which may cause deterioration of exchange coupling characteristics including an exchange field (Hex) of the variable resistance element 10.

A variable resistance element has a structure that exhibits different resistance states or values and is capable of being switched between different resistance states in response to an applied bias (e.g., a current or voltage). A resistance state of such a variable resistance element may be changed by applying a voltage or current of a sufficient magnitude (i.e., a threshold) in a data write operation. The different resistance states of different resistance values of the variable resistance element can be used for representing different data for data storage. Thus, the variable resistance element may store different data according to the resistance state. The variable resistance element may function as a memory cell. The memory cell may further include a selecting element coupled to the variable resistance element and controlling an access to the variable resistance element. Such memory cells may be arranged in various way to form a semiconductor memory.

In some implementations, the variable resistance element may be implemented to include a magnetic tunnel junction (MTJ) structure which includes a free layer having a variable magnetization direction, a pinned layer having a fixed magnetization direction and a tunnel barrier layer interposed therebetween. In response to a voltage or current of a sufficient amplitude applied to the variable resistance element, the magnetization direction of the free layer may be changed to a direction parallel or antiparallel to the magnetization direction of the pinned layer. Thus, the variable resistance element may switch between a low-resistance state and a high-resistance state to thereby store different data based on the different resistance states. The disclosed technology and its implementations can be used to provide an improved variable resistance element capable of satisfying or enhancing various characteristics required for the variable resistance element. For example, it is to provide the variable resistance element capable of preventing rapid deterioration of the spacer layer to secure a scalability and improving an exchange coupling characteristic by including a multilayer synthetic antiferromagnetic structure instead of the spacer layer having a single-layer structure in the SAF structure included in the MTJ structure.

Figure 2:
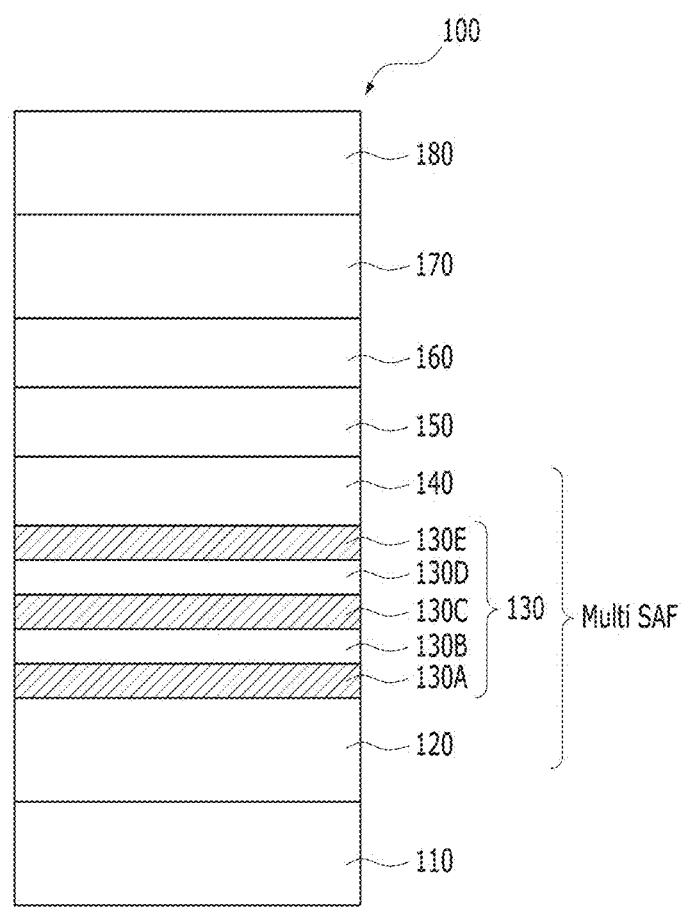
FIG. 2 is a cross-sectional view illustrating an example of a variable resistance element based on some implementations of the disclosed technology.

FIG. 2 is a cross-sectional view illustrating an example of a variable resistance element based on some implementations of the disclosed technology.

In some implementations, a variable resistance element 100 may include an MTJ structure including a free layer 170 having a variable magnetization direction, a pinned layer 140 having a pinned magnetization direction and a tunnel barrier layer 160 interposed between the free layer 170 and the pinned layer 140.

The free layer 170 may have one of different magnetization directions or one of different spin directions of electrons to switch the polarity of the free layer 170 in the MTJ structure, resulting in changes in resistance value. In some implementations, the polarity of the free layer 170 is changed or flipped upon application of a voltage or current signal (e.g., a driving current above a certain threshold) to the MTJ structure. With the polarity changes of the free layer 170, the free layer 170 and the pinned layer 140 have different magnetization directions or different spin directions of electron, which allows the variable resistance element 100 to store different data or represent different data bits. The free layer 170 may also be referred as a storage layer. The magnetization direction of the free layer 170 may be substantially perpendicular to a surface of the free layer 170, the tunnel barrier layer 160 and the pinned layer 140. In other words, the magnetization direction of the free layer 170 may be substantially parallel to stacking directions of the free layer 170, the tunnel barrier layer 160 and the pinned layer 140. Therefore, the magnetization direction of the free layer 170 may be changed between a downward direction and an upward direction. The change in the magnetization direction of the free layer 170 may be induced by a spin transfer torque generated by an applied current or voltage.

The free layer 170 may have a single-layer or multilayer structure including a ferromagnetic material. For example, the free layer 170 may include an alloy based on at least one of Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or others, or may include a stack of metals, such as Co/Pt, or Co/Pd, or others.

The tunnel barrier layer 160 may allow the tunneling of electrons in both data reading and data writing operations. In a write operation for storing new data, a high write current may be directed through the tunnel barrier layer 160 to change the magnetization direction of the free layer 170 and thus to change the resistance state of the MTJ for writing a new data bit. In a reading operation, a low reading current may be directed through the tunnel barrier layer 160 without changing the magnetization direction of the free layer 170 to measure the existing resistance state of the MTJ under the existing magnetization direction of the free layer 170 to read the stored data bit in the MTJ. The tunnel barrier layer 160 may include a dielectric oxide such as MgO, CaO, SrO, TiO, VO, or NbO or others.

The pinned layer 140 may have a pinned magnetization direction, which remains unchanged while the magnetization direction of the free layer 170 changes. The pinned layer 140 may be referred to as a reference layer. In some implementations, the magnetization direction of the pinned layer 140 may be pinned in a downward direction. In some implementations, the magnetization direction of the pinned layer 140 may be pinned in an upward direction.

The pinned layer 140 may have a single-layer or multilayer structure including a ferromagnetic material. For example, the pinned layer 140 may include an alloy based on at least one of Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or may include a stack of metals, such as Co/Pt, or Co/Pd or others.

In some implementations of the disclosed technology, the pinned layer 140 may form an antiferromagnetic exchange coupling with a shift canceling layer 120 through a spacer layer 130, which will be described as below.

If a voltage or current is applied to the variable resistance element 100, the magnetization direction of the free layer 170 may be changed by spin torque transfer. In some implementations, when the magnetization directions of the free layer 170 and the pinned layer 140 are parallel to each other, the variable resistance element 100 may be in a low resistance state, and this may indicate digital data bit "0." Conversely, when the magnetization directions of the free layer 170 and the pinned layer 140 are anti-parallel to each other, the variable resistance element 100 may be in a high resistance state, and this may indicate a digital data bit "1." In some implementations, the variable resistance element 100 can be configured to store data bit '1' when the magnetization directions of the free layer 170 and the pinned layer 140 are parallel to each other and to store data bit '0' when the magnetization directions of the free layer 170 and the pinned layer 140 are anti-parallel to each other.

In some implementations, the variable resistance element 100 may further include one or more layers performing various functions to improve a characteristic of the MTJ structure. For example, the variable resistance element 100 may further include at least one of a buffer layer 110, a shift canceling layer 120, a spacer layer 130 which can be a multicomposite layer, an intermediate layer 150, or a capping layer 180.

The buffer layer 110 may be disposed below other layers (e.g., the shift canceling layer 120) and on top of the substrate. The buffer layer 110 may function as a buffer between the substrate and the layers disposed above the buffer layer 110. The buffer layer 110 may facilitate the crystal growth of the layers disposed above the buffer layer 110, thus improving characteristics of the layers disposed above the buffer layer 110. The buffer layer 110 may have a single-layer or multilayer structure including a metal, a metal alloy, a metal nitride, or a metal oxide, or a combination thereof. Moreover, the buffer layer 110 may be formed of or include a material having a good compatibility with a bottom electrode (not shown) in order to resolve the lattice constant mismatch between the bottom electrode and the layers disposed above the buffer layer 110. For example, the buffer layer 110 may include tantalum (Ta).

The capping layer 180 may protect the variable resistance element 100 and function as a hard mask for patterning the variable resistance element 100. In some implementations, the capping layer 180 may include various conductive materials such as a metal. In some implementations, the capping layer 180 may include a metallic material having almost none or a small number of pin holes and high resistance to wet and/or dry etching. In some implementations, the capping layer 180 may include a metal, a nitride or an oxide, or a combination thereof. For example, the capping layer 180 may include a noble metal such as ruthenium (Ru).

In some implementations, the capping layer 180 may have a single-layer or a multilayer structure. For example, the capping layer 180 may have a multilayer structure including an oxide, a metal or a combination thereof. In some implementations, the capping layer 180 may have a multilayer structure including an oxide layer, a first metal layer, or a second metal layer.

The shift canceling layer 120 may serve to offset or reduce the effect of the stray magnetic field produced by the pinned layer 140. The effect of the stray magnetic field of the pinned layer 140 can decrease due to presence and operation of the shift canceling layer 120, and thus a biased magnetic field in the free layer 170 can decrease. Thus, the shift canceling layer 120 may invalidate a shift of the magnetization inversion of the free layer 170 due to the stray magnetic field generated by the pinned layer 140. The shift canceling layer 120 may be a magnetic layer that produces a magnetization to effectuate a magnetic field at the free layer 170 in a magnetization direction anti-parallel to the magnetization direction of the pinned layer 140. In the implementation, when the pinned layer 140 has a downward magnetization direction, the shift canceling layer 120 may have an upward magnetization direction. Conversely, when the pinned layer 140 has an upward magnetization direction, the shift canceling layer 120 may have a downward magnetization direction. The shift canceling layer 120 may be ferromagnetic structure and, in certain implementations, may have a single-layer or multilayer structure including one or more ferromagnetic materials.

A material layer (not shown) for resolving the lattice structure differences and the lattice constant mismatch between the pinned layer 140 and the shift canceling layer 120 may be interposed between the pinned layer 140 and the shift canceling layer 120. For example, this material layer may be amorphous and may include a metal a metal nitride, or metal oxide.

In the implementation, the shift canceling layer 120, the spacer layer 130 and the pinned layer 140 may form a multilayer synthetic anti-ferromagnetic (Multi SAF) structure.

The spacer layer 130 may be a multicomposite layer and may be interposed between the shift canceling layer 120 and the pinned layer 140 and function as a buffer between the shift canceling layer 120 and the pinned layer 140. The spacer layer 130 may serve to produce a strong anti-parallel exchange coupling between adjacent ferromagnetic layers. The spacer layer 130 may have a multilayer structure including a first non-magnetic layer 130A, a first magnetic layer 130B, a second non-magnetic layer 130C, a second magnetic layer 130D and a third non-magnetic layer 130E. The spacer layer 130 having a multilayer structure can be more resistant to process damage and withstand well. Thus, the spacer layer 130 can produce a strong anti-parallel exchange coupling between adjacent ferromagnetic layers in comparison with the case of single layer spacer shown in FIG. 1. In accordance with this implementation, the shift canceling layer 120 may be antiferromagnetically coupled to the first magnetic layer 130B through the first non-magnetic layer 130A, the first magnetic layer 130B may be antiferromagnetically coupled to the second magnetic layer 130D through the second non-magnetic layer 130C, and the second magnetic layer 130D may be antiferromagnetically coupled to the pinned layer 140 through the third non-magnetic layer 130E. Therefore, it is possible to produce a strong anti-parallel exchange coupling and secure scalability when the variable resistance element is scaled down.

In order to produce a strong exchange coupling between adjacent ferromagnetic layers in comparison with the case of single spacer layer, the spacer layer 130 should include n non-magnetic layers, wherein n may be an odd number that is equal to or greater than three (3), and n−1 magnetic layers, which are alternately stacked. Thus, each of the n non-magnetic layers and each of the n−1 magnetic layers are alternately stacked. In the implementation, the spacer layer 130 may have a multilayer structure including a first non-magnetic layer 130A, a first magnetic layer 130B, a second non-magnetic layer 130C, a second magnetic layer 130D and a third non-magnetic layer 130E. In the implementation shown in FIG. 2, the spacer layer 130 shows three non-magnetic layers and two magnetic layers (e.g., n is 3). However, the implementations shown in FIG. 2 is the example only and other implementations are also possible as long as n is the odd number that is equal to or greater than three (3). For example, the spacer layer 130 may include five (5) non-magnetic layers and four (4) magnetic layers which are alternately stacked. In some implementations, the spacer layer 130 may include seven (7) non-magnetic layers and six (6) magnetic layers which are alternately stacked. In some implementations, the spacer layer 130 may include nine (9) non-magnetic layers and eight (8) magnetic layers which are alternately stacked.

As such, the variable resistance element 100 may include the spacer layer 130 including the n non-magnetic layers 130A, 130c and 130E and the n−1 magnetic layers 130B and 130D which are alternately stacked. In accordance with the implementation, each of the pinned layer 140, the n−1 magnetic layers 130B and 130D and the shift canceling layer 120 may form a strong exchange coupling therebetween through three or more non-magnetic layers 130A, 130c and 130E. Therefore, it is possible to secure a stable exchange coupling characteristic including an exchange field (Hex) of the variable resistance element 100 and thus prevent rapid deterioration of an exchange coupling characteristic during scaling down.

In some implementations, in order to form the Multi SAF structure and exhibit a strong exchange coupling characteristic, the non-magnetic layers 130A, 130C and 130E may have a crystal structure of a face centered cubic or fcc (111) structure, and thus the magnetic layers 130B and 130D may have an fcc (111) structure.

In some implementations, the non-magnetic layers 130A, 130C and 130E may include Ru, Ir, Rh, or Cr or a combination thereof. Preferably, the non-magnetic layers 130A, 130C and 130E may include Ir or an alloy including Ir.

As described above, the shift canceling layer 120 may be antiferromagnetically coupled to the first magnetic layer 130B through the first non-magnetic layer 130A, the first magnetic layer 130B may be antiferromagnetically coupled to the second magnetic layer 130D through the second non-magnetic layer 130C, and the second magnetic layer 130D may be antiferromagnetically coupled to the pinned layer 140 through the third non-magnetic layer 130E. Each of the layers that are antiferromagnetically coupled may have a magnetization direction that is anti-parallel to each other. For example, the shift canceling layer 120 may have a magnetization direction which is anti-parallel to a magnetization direction of the first magnetic layer 130B, the first magnetic layer 130B may have a magnetization direction which is anti-parallel to a magnetization direction of the second magnetic layer 130D, and the second magnetic layer 130d may have a magnetization direction which is anti-parallel to a magnetization direction of the pinned layer 140. For example, when the pinned layer 140 has a downward magnetization direction, the shift canceling layer 120 and the second magnetic layer 130D may have an upward magnetization direction, and the first magnetic layer 130B may have a downward magnetization direction. When the pinned layer 140 has an upward magnetization direction, the shift canceling layer 120 and the second magnetic layer 130D may have a downward magnetization direction, and the first magnetic layer 130B may have an upward magnetization direction.

In accordance with the implementation including the Multi SAF structure, the pinned layer 140 and the second magnetic layer 130d can be strongly coupled in opposite directions and the first magnetic layer 130B and the shift canceling layer 120 can be strongly coupled in opposite magnetization directions. As a result, compared to the conventional SAF structure, it is possible to improve the size dependency of exchange coupling characteristics and secure the MTJ scalability.

The Multi SAF structure includes an odd number of non-magnetic layers in order to form a strong anti-ferromagnetic coupling between the pinned layer 140 and the second magnetic layer 130D and between the first magnetic layer 130B and the shift canceling layer 120. This multi SAF structure can prevent deterioration of the exchange coupling characteristic and improve a scalability compared to the spacer layer having a single-layer structure (see, reference numeral 10 of FIG. 1). This will be described in more detail with reference to FIGS. 6 to 9.

The relative positions of the pinned layer 140 and the shift canceling layer 120 shown in FIG. 2 may be interchanged.

The intermediate layer 150 may be interposed between the tunnel barrier layer 160 and the pinned layer 140. The intermediate layer 150 may be disposed adjacent to the spacer layer 130 as well as the tunnel barrier layer 160. Since the spacer layer 130 includes the non-magnetic layers 130A, 130C and 130E and the magnetic layers 130B and 130D which have an fcc (111) structure, the intermediate layer 150 may be texture decoupled with the spacer layer 130 and have a bcc (001) structure to improve the magnetoresistance (MR).

In some implementations, the intermediate layer 150 may include at least one of Co, Fe, Ni, B, or other noble metals, or a combination thereof.

In FIG. 2, the free layer 170 may be formed above the pinned layer 140. In another implementation, the free layer 170 may be formed under the pinned layer 140. This will be described with reference to FIG. 3.

Figure 3:
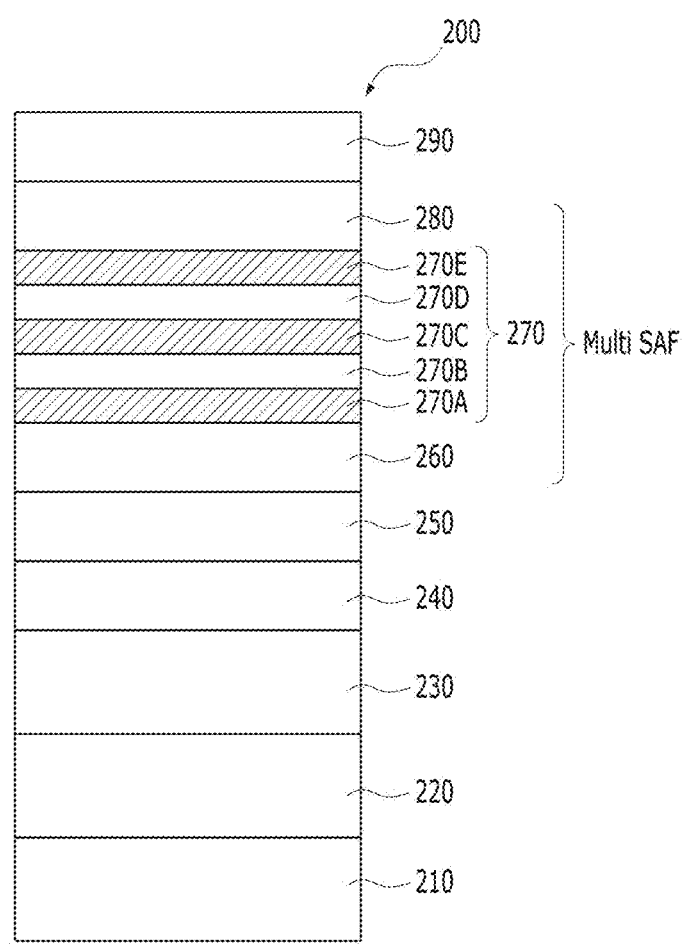
FIG. 3 is a cross-sectional view illustrating another example of a variable resistance element based on some implementations of the disclosed technology.

FIG. 3 is a cross-sectional view illustrating another example of a variable resistance element based on some implementations of the disclosed technology. The description will be focused on features different from those discussed with respect to FIG. 2.

Referring to FIG. 3, a variable resistance element 200 in accordance with the implementation may include a buffer layer 210, an under layer 220, a free layer 230, a tunnel barrier layer 240, an intermediate layer 250, a pinned layer 260, a spacer layer 270, a shift canceling layer 280 and a capping layer 290. There is a difference between the variable resistance element 200 shown in FIG. 3 and the variable resistance element 100 shown in FIG. 2 in that in the variable resistance element 200 shown in FIG. 3, the pinned layer 260 is located above the free layer 230.

In the implementation, the shift canceling layer 280, the spacer layer 270 and the pinned layer 260 may form a Multi SAF structure.

The spacer layer 270 which can be a multicomposite layer may be interposed between the pinned layer 260 and the shift canceling layer 280. The spacer layer 270 may have a multilayer structure including a first non-magnetic layer 270A, a first magnetic layer 270B, a second non-magnetic layer 270C, a second magnetic layer 270D and a third non-magnetic layer 270E serve to produce a strong anti-parallel exchange coupling between adjacent ferromagnetic layers. The spacer layer 270 having a multilayer structure can be more resistant to process damage and withstand well. Thus, the spacer layer 270 can produce a strong anti-parallel exchange coupling between adjacent ferromagnetic layers in comparison with the case of single layer spacer shown in FIG. 1. In accordance with this implementation, the pinned layer 260 may be antiferromagnetically coupled to the first magnetic layer 270B through the first non-magnetic layer 270A, the first magnetic layer 270B may be antiferromagnetically coupled to the second magnetic layer 270D through the second non-magnetic layer 270C, and the second magnetic layer 270D may be antiferromagnetically coupled to shift canceling layer 280 through the third non-magnetic layer 270E. Therefore, it is possible to produce a strong anti-parallel exchange coupling and secure scalability when the variable resistance element is scaled down.

In order to produce a strong exchange coupling between adjacent ferromagnetic layers in comparison with the case of single spacer layer, the spacer layer 270 should include n non-magnetic layers and n–1 magnetic layers, which are alternately stacked. n may be an odd number of three (3) or more. In the implementation, the spacer layer 270 may have a multilayer structure including a first non-magnetic layer 270A, a first magnetic layer 270B, a second non-magnetic layer 270C, a second magnetic layer 270D and a third non-magnetic layer 270E. In the implementation shown in FIG. 3, the spacer layer 270 shows three non-magnetic layers and two magnetic layers (e.g., n is 3). However, the implementations shown in FIG. 3 is the example only and other implementations are also possible as long as n is the odd number that is equal to or greater than three (3). For example, the spacer layer 270 may include five (5) non-magnetic layers and four (4) magnetic layers which are alternately stacked. In some implementations, the spacer layer 270 may include seven (7) non-magnetic layers and six (6) magnetic layers which are alternately stacked. In some implementations, the spacer layer 270 may include nine (9) non-magnetic layers and eight (8) magnetic layers which are alternately stacked.

In accordance with the implementation, each of the pinned layer 260, the n–1 magnetic layers 270B and 270D and the shift canceling layer 280 may form a strong exchange coupling therebetween through three or more non-magnetic layers 270A, 270C and 270E. Therefore, it is possible to secure a stable exchange coupling characteristic including an exchange field (Hex) of the variable resistance element 200 and thus prevent rapid deterioration of an exchange coupling characteristic during scaling down.

In some implementations, in order to form the Multi SAF structure and exhibit a strong exchange coupling characteristic, the non-magnetic layers 270A, 270C and 270E may have an fcc (111) structure, and thus the magnetic layers 270B and 270D may have an fcc (111) structure.

In some implementations, the non-magnetic layers 270A, 270C and 270E may include Ru, Ir, Rh, or Cr or a combination thereof. Preferably, the non-magnetic layers 270A, 270C and 270E may include Ir or an alloy including Ir.

The under layer 220 may serve to improve a perpendicular magnetic anisotropy of the free layer 230. The under layer 220 may have a single-layer or multilayer structure including a metal, a metal alloy, a metal nitride, a metal oxide, or a combination thereof.

The descriptions for the buffer layer 210, the free layer 230, the tunnel barrier layer 240, the intermediate layer 250, the pinned layer 260, the spacer layer 270, the shift canceling layer 280 and the capping layer 290 may be substantially similar to those of the implementation shown in FIG. 2.

In this implementation, the pinned layer 260, the spacer layer 270 and the shift canceling layer 280 may form the Multi SAF structure having a strong anti-ferromagnetic coupling. Therefore, it is possible to improve the size dependency of exchange coupling characteristics and secure the MTJ scalability.

In the implementations shown in FIGS. 2 and 3, it is the pinned layer 140 or 260 that form the multi SAF structure with the spacer layer 130 or 270 and the shift canceling layer 120 or 280. However, another implementation is possible that the free layer forms the Multi SAF structure. This will be described with reference to FIGS. 4 and 5.

Figure 4:
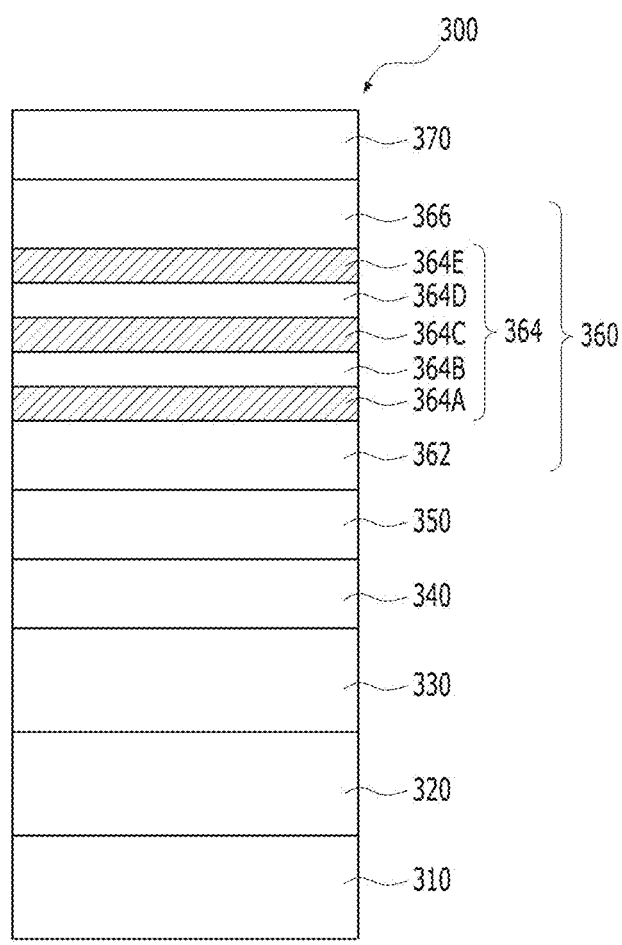
FIG. 4 is a cross-sectional view illustrating another example of a variable resistance element based on some implementations of the disclosed technology.

FIG. 4 is a cross-sectional view illustrating another example of a variable resistance element based on some implementations of the disclosed technology. The description will be focused on features different from those discussed with respect to FIG. 2.

Referring to FIG. 4, a variable resistance element 300 in accordance with the implementation may include a buffer layer 310, an under layer 320, a pinned layer 330, an intermediate layer 340, a tunnel barrier layer 350, a free layer 360 and a capping layer 370. The free layer 360 may include a first sub layer 362, a spacer layer 364 and a second sub layer 366. The first sub layer 362, the spacer layer 364 and the second sub layer 366 may for a Multi SAF structure. There is a difference between the variable resistance element 300 shown in FIG. 4 and the variable resistance element 100 shown in FIG. 2 in that in it is the free layer 360 that forms the multi SAF structure of the variable resistance element 300 shown in FIG. 4.

The spacer layer 364 which can be a multicomposite layer may include n non-magnetic layers and n−1 magnetic layers, which are alternately stacked. n may be an odd number of three (3) or more. In the implementation, the spacer layer 364 may have a multilayer structure including a first non-magnetic layer 364A, a first magnetic layer 364B, a second non-magnetic layer 364C, a second magnetic layer 364D and a third non-magnetic layer 364E. In the implementation shown in FIG. 4, the spacer layer 364 shows three non-magnetic layers and two magnetic layers (e.g., n is 3). However, the implementations shown in FIG. 4 is the example only and other implementations are also possible as long as n is the odd number that is equal to or greater than three (3). For example, the spacer layer 364 may include five (5) non-magnetic layers and four (4) magnetic layers which are alternately stacked. In some implementations, the spacer layer 364 may include seven (7) non-magnetic layers and six (6) magnetic layers which are alternately stacked. In some implementations, the spacer layer 364 may include nine (9) non-magnetic layers and eight (8) magnetic layers which are alternately stacked.

In the implementation, spacer layer 364 may serve to produce a strong anti-parallel exchange coupling between adjacent ferromagnetic layers. The spacer layer 364 having a multilayer structure can be more resistant to process damage and withstand well. Thus, the spacer layer 364 can produce a strong anti-parallel exchange coupling between adjacent ferromagnetic layers in comparison with the case of single layer spacer.

In this implementation, the first sub layer 362 may be antiferromagnetically coupled to the first magnetic layer 364B though the first non-magnetic layer 364A, the first magnetic layer 364B may be antiferromagnetically coupled to the second magnetic layer 364D through the second non-magnetic layer 364C, and the second magnetic layer 364D may be antiferromagnetically coupled to the second sub layer 366 through the third non-magnetic layer 364E. Therefore, it is possible to produce a strong anti-parallel exchange coupling and secure scalability when the variable resistance element is scaled down.

The first sub layer 362 and the second sub layer 366 may have a single-layer or multilayer structure including a ferromagnetic material. For example, the first sub layer 362 and the second sub layer 366 may include an alloy based on at least one of Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or others, or may include a stack of metals, such as Co/Pt, or Co/Pd, or others.

In the Multi SAF structure in accordance with the implementation, the first sub layer 362 that substantially contributes to MR may have a bcc (001) structure in order to improve MR. Thus, the first sub layer 362 that is a magnetic layer close to the tunnel barrier layer 350 is crystallized in a bcc (001) direction, thereby ensuring sufficient exchange coupling energy and improving MR.

A material layer (not shown) for resolving the lattice structure differences and the lattice constant mismatch between the first sub layer 362 and the second sub layer 366 may be interposed between the first sub layer 362 and the second sub layer 366. For example, this material layer may be amorphous and may include a metal, a metal nitride, or metal oxide.

In some implementations, in order to form the Multi SAF structure and exhibit a strong exchange coupling characteristic, the non-magnetic layers 364A, 364C and 364E may have an fcc (111) structure. In some implementations, the magnetic layers 364B and 364D may have an fcc (111) structure.

In some implementations, the non-magnetic layers 364A, 364C and 364E may include Ru, Ir, Rh, or Cr or a combination thereof. Preferably, the non-magnetic layers 364A, 364C and 364E may include Ir or an alloy including Ir.

In the implementation, since the free layer 360 forms the Multi SAF structure, it is possible to improve the size dependency of exchange coupling characteristics and secure the MTJ scalability compared to the conventional SAF structure.

In the variable resistance element 300 shown in FIG. 4, the free layer 360 is disposed over the pinned layer 330. In another implementation, the free layer 360 may be disposed under the pinned layer 330. This will be further described with reference to FIG. 5.

Figure 5:
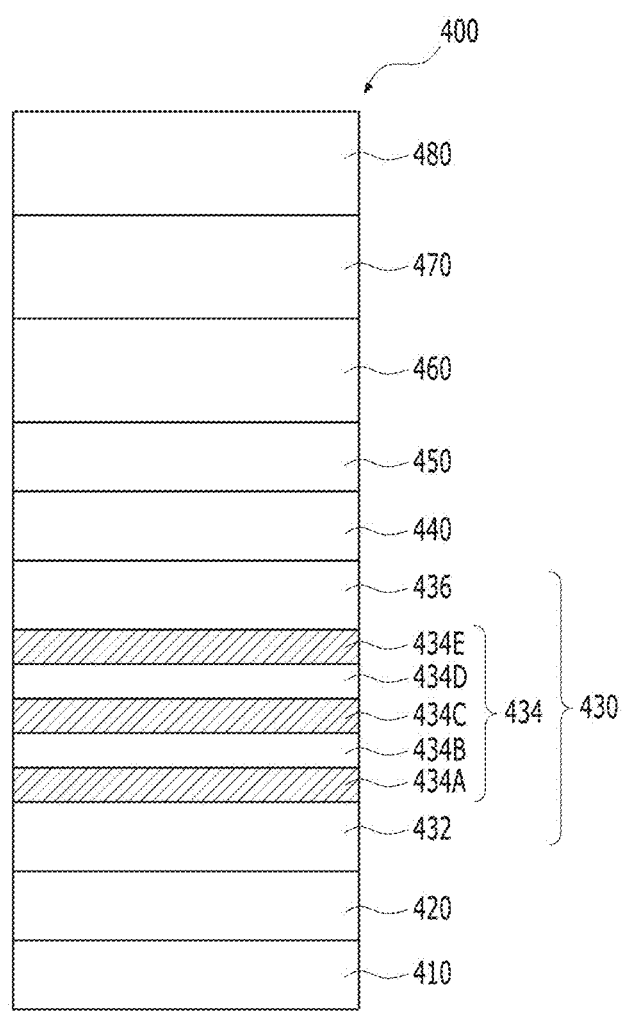
FIG. 5 is a cross-sectional view illustrating another example of a variable resistance element based on some implementations of the disclosed technology.

FIG. 5 is a cross-sectional view illustrating another example of a variable resistance element based on some implementations of the disclosed technology. The description will be focused on features different from those discussed with respect to FIGS. 3 and 4.

Referring to FIG. 5, a variable resistance element 400 in accordance with the implementation may include a buffer layer 410, an under layer 420, a free layer 430, a tunnel barrier layer 440, an intermediate layer 450, a pinned layer 460, shift canceling layer 470 and a capping layer 480. The free layer 430 may include a first sub layer 432, a spacer layer 434 and a second sub layer 436. The first sub layer 432, the spacer layer 434 and the second sub layer 436 may for a Multi SAF structure. There is a difference between the variable resistance element 400 shown in FIG. 5 and the variable resistance element 300 shown in FIG. 4 in that in the variable resistance element 400 shown in FIG. 5, the free layer 430 is disposed under the pinned layer 460. Also, there is a difference between the variable resistance element 400 shown in FIG. 5 and the variable resistance element 200 shown in FIG. 3 in that in the variable resistance element 400 shown in FIG. 5, the free layer 430 forms the Multi SAF structure.

The spacer layer 434 may include n non-magnetic layers and n−1 magnetic layers, which are alternately stacked. n may be an odd number of 3 or more. In the implementation, the spacer layer 434 may have a multilayer structure including a first non-magnetic layer 434A, a first magnetic layer 434B, a second non-magnetic layer 434C, a second magnetic layer 434D and a third non-magnetic layer 434E. In the implementation shown in FIG. 5, the spacer layer 434 shows three non-magnetic layers and two non-magnetic layers (e.g., n is 3). However, the implementations shown in FIG. 5 is the example only and other implementations are also possible as long as n is the odd number that is equal to or greater than 3. For example, the spacer layer 434 may include 5 non-magnetic layers and 4 magnetic layers which are alternately stacked. In some implementations, the spacer layer 434 may include 7 non-magnetic layers and 6 magnetic layers which are alternately stacked. In some implementations, the spacer layer 434 may include 9 non-magnetic layers and 8 magnetic layers which are alternately stacked.

In the implementation, spacer layer 434 may serve to produce a strong anti-parallel exchange coupling between adjacent ferromagnetic layers. The spacer layer 434 having a multilayer structure can be more resistant to process damage and withstand well. Thus, the spacer layer 434 can produce a strong anti-parallel exchange coupling between adjacent ferromagnetic layers in comparison with the case of a single layer spacer.

In this implementation, the first sub layer 432 may be antiferromagnetically coupled to the first magnetic layer 434B though the first non-magnetic layer 434A, the first magnetic layer 434B may be antiferromagnetically coupled to the second magnetic layer 434D through the second non-magnetic layer 434C, and the second magnetic layer 434D may be antiferromagnetically coupled to the second sub layer 436 through the third non-magnetic layer 434E. Therefore, it is possible to produce a strong anti-parallel exchange coupling and secure scalability when the variable resistance element is scaled down.

In some implementations, in order to exhibit a strong exchange coupling characteristic, the non-magnetic layers 434A, 434C and 434E may have an fcc (111) structure. In some implementations, the magnetic layers 434B and 434D may have an fcc (111) structure.

In the Multi SAF structure in accordance with the implementation, the second sub layer 436 that substantially contributes to MR may have a bcc (001) structure in order to improve MR. Thus, the second sub layer 436 that is a magnetic layer close to the tunnel barrier layer 440 is crystallized in a bcc (001) direction, thereby ensuring sufficient exchange coupling energy and improving MR.

In the implementation, since the free layer 430 forms the Multi SAF structure, it is possible to improve the size dependency of exchange coupling characteristics and secure the MTJ scalability compared to the conventional SAF structure.

The effects exhibited by the implementations will be described with reference to FIGS. 6 to 9.

Figure 6:
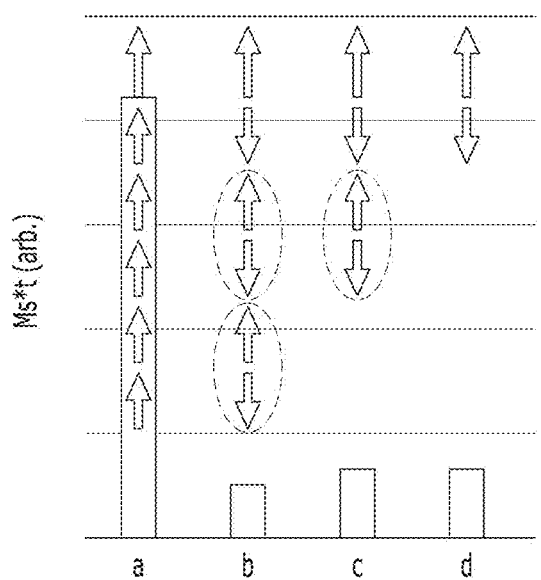
FIG. 6 is a graph illustrating a Ms*t value of structures based on some implementations of the disclosed technology and a Comparative Example, respectively.

FIG. 6 is a graph illustrating a Ms*t value of structures based on some implementations of the disclosed technology and a Comparative Example, respectively.

In FIG. 6, Ms represents saturation magnetization, t represents a thickness of the multilayer structure, and an arrow represents a magnetization direction in each magnetic layer (Co layer) included in the multilayer structure. Each multilayer structure is as follows:

(a) Co/[Pt/Co]$_5$
(b) Co/[Ir/Co]$_5$
(c) Co/[Ir/Co]$_3$
(d) Co/[Ir/Co]$_1$

In the multilayer structure, the number represents the number of times that thin film is stacked. For example, Co/[Pt/Co]$_5$ includes a Co layer and 5 Pt/Co layers disposed below the Co layer. In the multilayer structures of (a) to (d), Co layers have the same thickness as one another, and Ir layers have the same thickness as one another.

Referring to FIG. 6, in the multilayer structure including Pt, which is (a) Co/[Pt/Co]$_5$, each magnetic layer may have a magnetization direction that is parallel to each other to show a large Ms*t value. In the multilayer structure including Ir, which is (b) Co/[Ir/Co]$_5$, as indicated by the dotted eclipses, two adjacent magnetic layers that are above and below the Ir layer may have magnetization directions that are anti-parallel to each other so that magnetization moment of each magnetic layer may be offset and the Ms*t value can be determined as only the difference in magnetization moment by the upper two magnetic layers as shown in FIG. 6. Therefore, the Ms*t value of (b) Co/[Ir/Co]$_5$, may show an Ms*t value that is smaller than that of (a) Co/[Pt/Co]$_5$. In case of (c) Co/[Ir/Co]$_3$, although the number of [Ir/Co] layer is decreased compared to (b) Co/[Ir/Co]$_5$, it shows a similar Ms*t value to that of (b) Co/[Ir/Co]$_5$. This may mean that adjacent Co layers (magnetic layer) that are above and below the Ir layer (non-magnetic layer) form a strong antiferromagnetic coupling. In case of (d) Co/[Ir/CO]$_1$ which includes two Co layers and an Ir layer interposed therebetween, although the Co layers may be antiferromagnetically coupled to each other, characteristics of the Ir single layer can be may be remarkably deteriorated during the scaling down of the variable resistance element, which can cause a rapid decrease in an exchange field (Hex).

Figure 7:
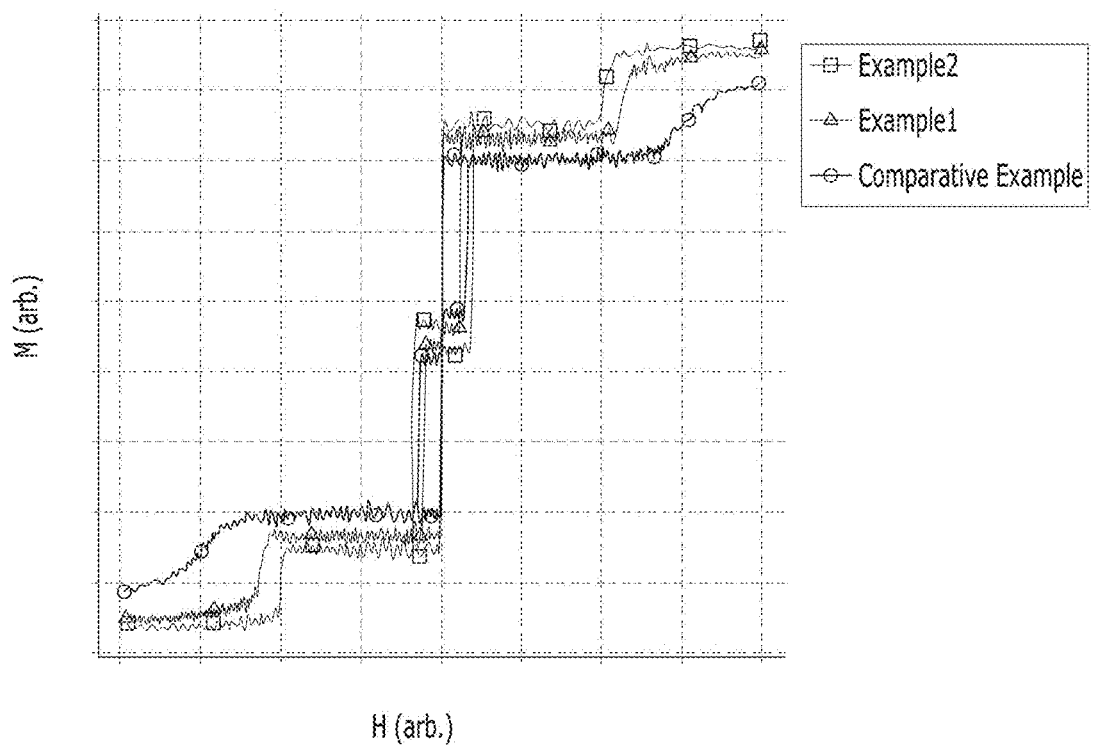
FIG. 7 is a graph illustrating an M-H magnetization curve of structures based on some implementations of the disclosed technology and a Comparative Example, respectively.

FIG. 7 is a graph illustrating an M-H magnetization curve of structures based on some implementations of the disclosed technology and a Comparative Example, respectively.

In FIG. 7, the horizontal axis represents a strength of a magnetic field (H) and the vertical axis represents a strength of magnetization (M). Example 1 represents the variable resistance element including the Multi SAF structure including the shift canceling layer/first non-magnetic layer/first magnetic layer/second non-magnetic layer/second magnetic layer/third non-magnetic layer/pinned layer, Example 2 represent the variable resistance element including the Multi SAF structure including the shift canceling layer/first non-magnetic layer/first magnetic layer/second non-magnetic layer/pinned layer, and Comparative Example represent the variable resistance element including the SAF structure including shift canceling layer/spacer layer/pinned layer.

Referring to FIG. 7, the Multi SAF structure in accordance with Examples 1 and 2 shows a steeper slope in the M-H magnetization curve compared to the SAF structure in accordance with Comparative Example. Therefore, in accordance with the implementations, it is possible to exhibit a better vertical magnetic anisotropy characteristic.

Figure 8:
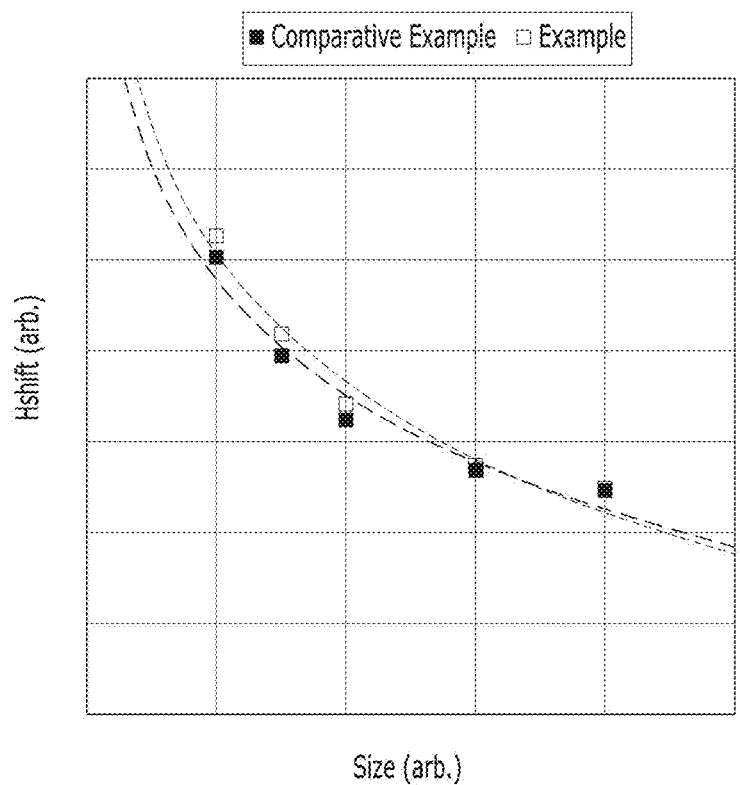
FIG. 8 is a graph illustrating a Hshift value of structures based on some implementations of the disclosed technology and a Comparative Example, respectively.

FIG. 8 is a graph illustrating a Hshift value of structures based on some implementations of the disclosed technology and a Comparative Example, respectively.

In FIG. 8, the horizontal axis represents a size (diameter) of the variable resistance element and the vertical axis represents a Hshift value. Example represents the variable resistance element including the Multi SAF structure including the shift canceling layer/first non-magnetic layer/first magnetic layer/second non-magnetic layer/second magnetic layer/third non-magnetic layer/pinned layer, and Comparative Example represents the SAF structure including shift canceling layer/spacer layer/pinned layer.

Hshift may be an index indicating how the magnetization reversal characteristic of the free layer shifts due to the stray magnetic field derived from the intermediate layer and the pinned layer. In the SAF structure, if each magnetic layer does not form a complete antiferromagnetic coupling, the Hshift value may be increased.

Referring to FIG. 8, in the Multi SAF structure in accordance with Example, the shift canceling layer may be strongly antiferromagnetically coupled to the first magnetic layer through the first non-magnetic layer, the first magnetic layer may be strongly antiferromagnetically coupled to the second magnetic layer through the second non-magnetic layer, and the second magnetic layer may be strongly antiferromagnetically coupled to the pinned layer through the third non-magnetic layer. Therefore, it can be seen that the Hshift value may not be increased and it is easy to secure scalability when the variable resistance element is scaled down.

Figure 9:
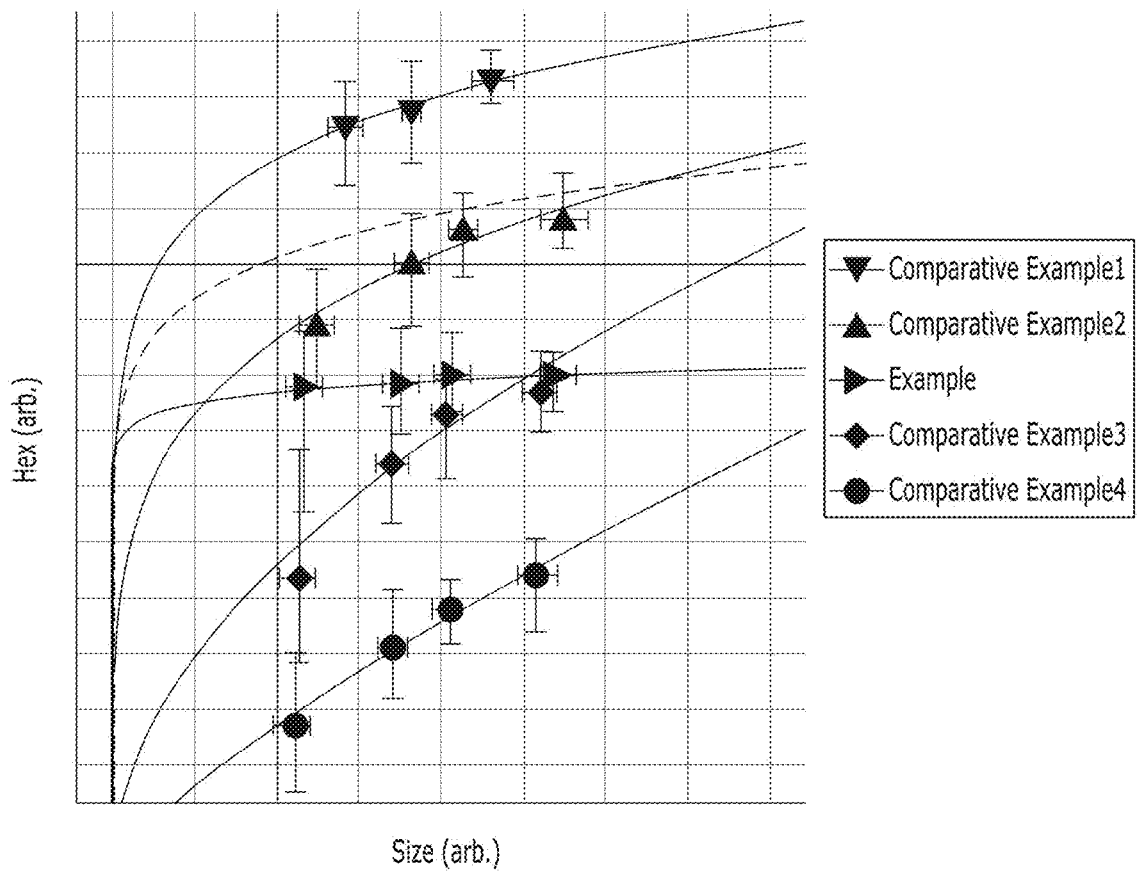
FIG. 9 is a graph illustrating an exchange coupling strength of structures based on some implementations of the disclosed technology and a Comparative Example, respectively.

FIG. 9 is a graph illustrating an exchange coupling strength of structures based on some implementations of the disclosed technology and a Comparative Example, respectively.

In FIG. 9, the horizontal axis represents a size (diameter) of the variable resistance element and the vertical axis represents an exchange field (Hex). Example represents the variable resistance element including the Multi SAF structure including the shift canceling layer/first non-magnetic layer/first magnetic layer/second non-magnetic layer/pinned layer, and Comparative Examples 1 to 4 represent the SAF structure including shift canceling layer/spacer layer/pinned layer, wherein each spacer layer has different thickness from one another. The first non-magnetic layer, the second non-magnetic layer and the spacer layer are formed of or include the same material as one another. The thickness of the spacer layer of Comparative Examples 1 to 4 is as follows: Comparative Examples 1<Comparative Examples 2<Comparative Examples 3<Comparative Examples 4. The thickness of the first and second non-magnetic layer of the Example is the same as the thickness of the Comparative Examples 3.

The exchange coupling strength characteristic is sensitive to the thickness of the spacer layer. When the thickness of the space layer is thick, the exchange coupling strength may be rapidly deteriorated and the exchange coupling strength may be more rapidly deteriorated during scaling down of the variable resistance element.

Referring to FIG. 9, compared to Comparative Examples 1 to 4 (especially compared to Comparative Example 3 which includes the spacer layer whose thickness is same as that of the first and second non-magnetic layers included in the structure of the Example), the graph of the Example has the smallest slope and it can be seen that there is almost no deterioration of the exchange coupling strength due to the size reduction. The broken line represents the simulation characteristics in case that the thickness of the first and second non-magnetic layer of Example is same as the thickness of the spacer layer of Comparative Example 2. From the graph with the broken line, it can also be confirmed that the Multi SAF structure in accordance with the implementation has a significantly superior scalability compared to Comparative Examples 1 to 4.

Figure 10A:
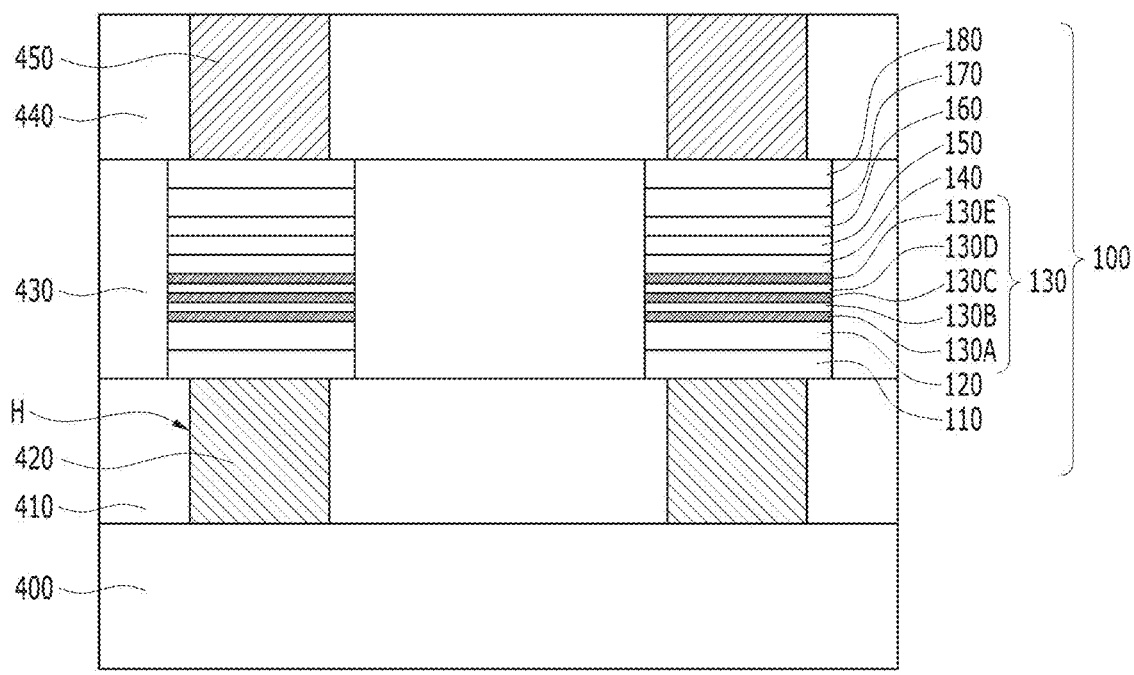
FIG. 10A is a cross-sectional view illustrating an example of a memory device fabricated according to a method based on some implementations of the disclosed technology.
Figure 10B:
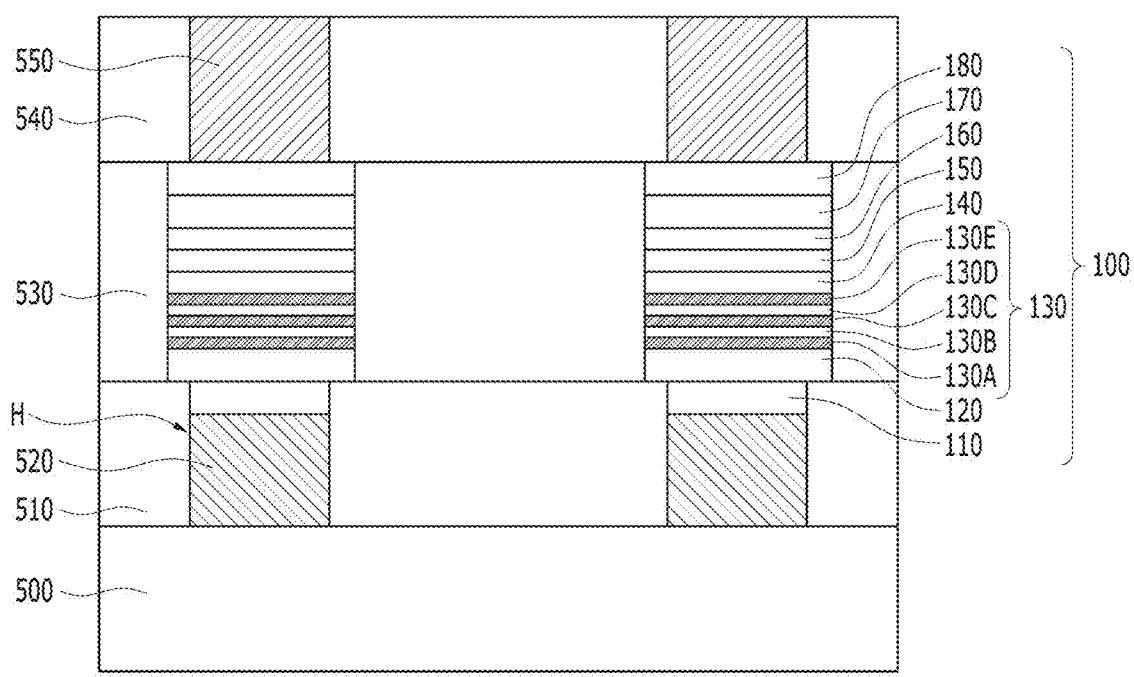
FIG. 10B is a cross-sectional view illustrating another example of the memory device fabricated according to a method based on some implementations of the disclosed technology.

A semiconductor memory device as disclosed in this document may include a cell array of variable resistance elements 100, 200, 300 and 400. The semiconductor memory may further include various components such as lines, elements, etc. to drive or control each of the variable resistance elements 100, 200, 300 and 400. This is exemplarily explained with reference to FIGS. 10A and 10B. In FIGS. 10A and 10B, the variable resistance element 100 shown in FIG. 2 is explained. The similar explanation can be applied to the variable resistance elements 200, 300 and 400 shown in FIGS. 3 to 5, respectively.

FIG. 10A is a cross-sectional view for explaining an example of a memory device and an example method for fabricating the memory device based on some implementations of the disclosed technology.

Referring to FIG. 10A, the memory device of the implementation may include a substrate 400, lower contacts 420 formed over the substrate 400, variable resistance element 100 formed over the lower contacts 420 and upper contacts 450 formed over the variable resistance element 100. For each variable resistance element 100, a specific structure as a switch or switching circuit/element, for example, a transistor, for controlling an access to a particular variable resistance element 100 can be provided over the substrate 400 to control the variable resistance element 100, where the switch can be turned on to select the variable resistance element 100 or turned off to de-select the variable resistance element 100. The lower contacts 420 may be disposed over the substrate 400, and couple a lower end of the variable resistance element 100 to a portion of the substrate 400, for example, a drain of the transistor as the switching circuit for the variable resistance element 100. The upper contact 450 may be disposed over the variable resistance element 100, and couple an upper end of the variable resistance element 100 to a certain line (not shown), for example, a bit line. In FIG. 10A, two variable resistance elements 100 are shown as examples of the elements in an array of variable resistance elements 100.

First, the substrate 400 in which the transistor is formed may be provided, and then, a first interlayer dielectric layer 410 may be formed over the substrate 400. Then, the lower contact 420 may be formed by selectively etching the first interlayer dielectric layer 410 to form a hole H exposing a portion of the substrate 400 and filling the hole H with a conductive material. Then, the variable resistance element 100 may be formed by forming material layers for the variable resistance element 100 over the first interlayer dielectric layer 410 and the lower contact 420, and selectively etching the material layers. The etch process for forming the variable resistance element 100 may include the IBE method which has a strong physical etching characteristic. Then, a second interlayer dielectric layer 430 may be formed to cover the variable resistance element 100. Then, a third interlayer dielectric layer 440 may be formed over the variable resistance element 100 and the second interlayer dielectric layer 430, and then upper contacts 450 passing through the third interlayer dielectric layer 440 and coupled to an upper end of the variable resistance element 100 may be formed.

In the memory device based on this implementation, all layers forming the variable resistance element 100 may have sidewalls which are aligned with one another. That is because the variable resistance element 100 is formed through an etch process using one mask.

Unlike the implementation of FIG. 10A, a part of the variable resistance element 100 may be patterned separately from other parts. This process is illustrated in FIG. 10B.

FIG. 10B is a cross-sectional view for explaining a memory device and a method for fabricating the memory device based on another implementation of the present disclosure. The following descriptions will be focused on features difference from those discussed with respect to FIG. 10A.

Referring to FIG. 10B, the memory device based on this implementation may include a variable resistance element 100 of which parts, for example, a buffer layer 110 has sidewalls that are not aligned with other layers thereof. As shown in FIG. 10B, the buffer layer 110 may have sidewalls which are aligned with lower contacts 520.

The memory device in FIG. 10B may be fabricated by following processes.

First, a first interlayer dielectric layer 510 may be formed over a substrate 500, and then selectively etched to form a hole H exposing a portion of the substrate 500. The, the lower contacts 520 may be formed to fill a lower portion of the hole H. For example, the lower contacts 520 may be formed through a series of processes of forming a conductive material to cover the resultant structure having the hole formed therein, and removing a part of the conductive material through an etch back process until the conductive material has a desired thickness. Then, the buffer layer 110 may be formed so as to fill the remaining portion the hole H. For example, the buffer layer 110 may be formed by forming a material layer for forming the buffer layer 110 which covers the resultant structure in which the lower contacts 520 is formed, and then performing a planarization process such as a CMP (Chemical Mechanical Planarization) until a top surface of the first interlayer dielectric layer 510 is exposed. Then, the remaining parts of the variable resistance element 100 may be formed by forming material layers for forming the remaining layers of the variable resistance element 100 except the buffer layer 110 over the lower contacts 520 and the first interlayer dielectric layer 510.

Subsequent processes are substantially the same as those as shown in FIG. 10A.

In this implementation, the height which needs to be etched at a time in order to form the variable resistance element 100 can be reduced, which makes it possible to lower the difficulty level of the etch process.

Although in this implementation, the buffer layer 110 is buried in the hole H, other parts of the variable resistance element 100 may also be buried as needed.

The above and other memory circuits or semiconductor devices based on the disclosed technology can be used in a range of devices or systems. FIGS. 11 to 15 provide some examples of devices or systems that can implement the memory circuits disclosed herein.

Figure 11:
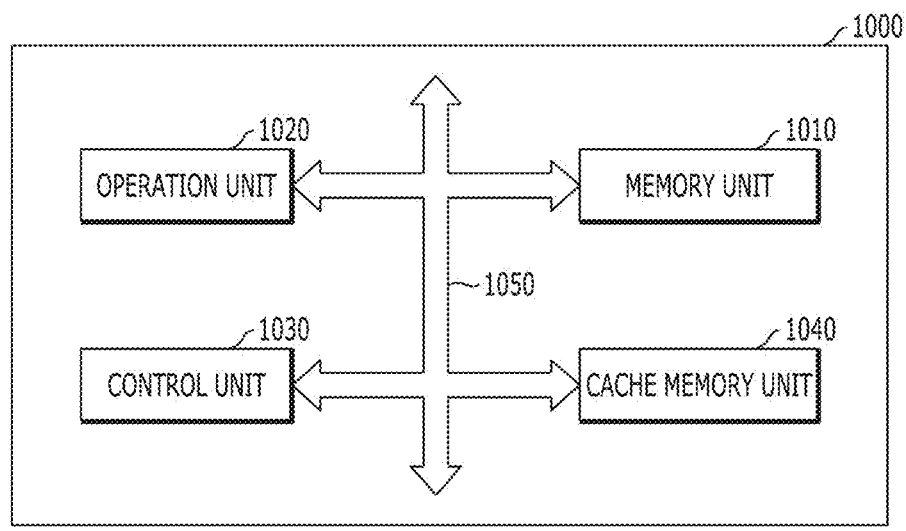
FIG. 11 is an example configuration diagram of a microprocessor including memory circuitry based on an implementation of the disclosed technology.

FIG. 11 is an example configuration diagram of a microprocessor including memory circuitry based on the disclosed technology.

Referring to FIG. 11, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing circuits such as a central processing unit (CPU), a graphic processing unit (GPU), a digital signal processor (DSP) and an application processor (AP).

The memory unit 1010 is a part which stores data in the microprocessor 1000, as a processor, register. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices based on the implementations. For example, the memory unit 1010 may include a multilayer synthetic anti-ferromagnetic (Multi SAF) structure including a first ferromagnetic layer, a second ferromagnetic layer, and a spacer layer interposed between the first ferromagnetic layer and the second ferromagnetic layer, wherein the spacer layer may include n non-magnetic layers and n−1 magnetic layers that are disposed such that each of the n non-magnetic layers and each of the n−1 magnetic layers are alternately stacked, wherein n indicates an odd number equal to or greater than 3, wherein the n−1 magnetic layers and n non-magnetic layers may be configured to effectuate an antiferromagnetic exchange coupling with at least one of the first ferromagnetic layer and the second ferromagnetic layer. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 12:
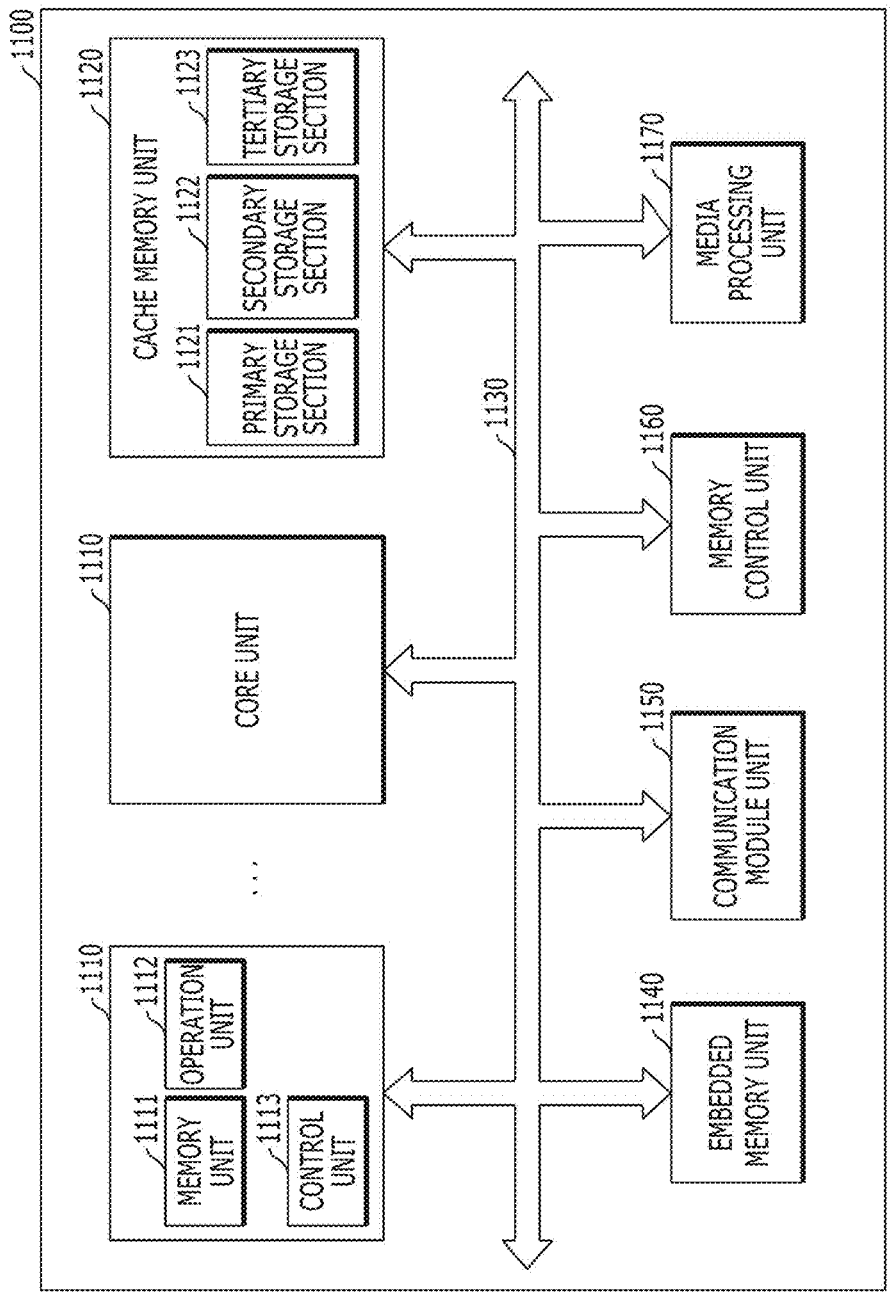
FIG. 12 is an example configuration diagram of a processor including memory circuitry based on an implementation of the disclosed technology.

FIG. 12 is an example configuration diagram of a processor including memory circuitry based on an implementation of the disclosed technology.

Referring to FIG. 12, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this implementation is operable to perform arithmetic logic operations for data inputted from an external device, and may include a memory unit 1111, an operation unit 1112 and a control unit 1113.

The memory unit 1111 is operable to store data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is configured to perform operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is operable to temporarily store data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices based on the implementations. For example, the cache memory unit 1120 may include a multilayer synthetic anti-ferromagnetic (Multi SAF) structure including a first ferromagnetic layer, a second ferromagnetic layer, and a spacer layer interposed between the first ferromagnetic layer and the second ferromagnetic layer, wherein the spacer layer may include n non-magnetic layers and n−1 magnetic layers that are disposed such that each of the n non-magnetic layers and each of the n−1 magnetic layers are alternately stacked, wherein n indicates an odd number equal to or greater than 3, wherein the n−1 magnetic layers and n non-magnetic layers may be configured to effectuate an antiferromagnetic exchange coupling with at least one of the first ferromagnetic layer and the second ferromagnetic layer. Through this, data storage characteristics of the cache memory unit 1120 may be improved. As a consequence, operating characteristics of the processor 1100 may be improved.

Although it was shown in FIG. 12 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is operable to connect the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core units 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 13:
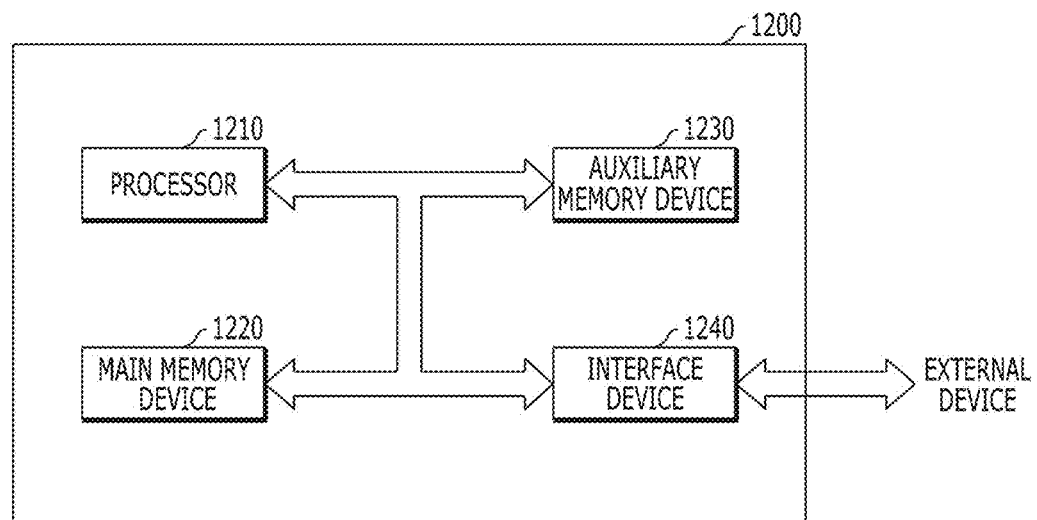
FIG. 13 is an example configuration diagram of a system including memory circuitry based on an implementation of the disclosed technology.

FIG. 13 is an example configuration diagram of a system including memory circuitry based on an implementation of the disclosed technology.

Referring to FIG. 13, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include a multilayer synthetic anti-ferromagnetic (Multi SAF) structure including a first ferromagnetic layer, a second ferromagnetic layer, and a spacer layer interposed between the first ferromagnetic layer and the second ferromagnetic layer, wherein the spacer layer may include n non-magnetic layers and n−1 magnetic layers that are disposed such that each of the n non-magnetic layers and each of the n−1 magnetic layers are alternately stacked, wherein n indicates an odd number equal to or greater than 3, wherein the n−1 magnetic layers and n non-magnetic layers may be configured to effectuate an antiferromagnetic exchange coupling with at least one of the first ferromagnetic layer and the second ferromagnetic layer. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices based on the implementations. For example, the auxiliary memory device 1230 may include a multilayer synthetic anti-ferromagnetic (Multi SAF) structure including a first ferromagnetic layer, a second ferromagnetic layer, and a spacer layer interposed between the first ferromagnetic layer and the second ferromagnetic layer, wherein the spacer layer may include n non-magnetic layers and n−1 magnetic layers that are disposed such that each of the n non-magnetic layers and each of the n−1 magnetic layers are alternately stacked, wherein n indicates an odd number equal to or greater than 3, wherein the n−1 magnetic layers and n non-magnetic layers may be configured to effectuate an antiferromagnetic exchange coupling with at least one of the first ferromagnetic layer and the second ferromagnetic layer. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 14) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 14) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 14:
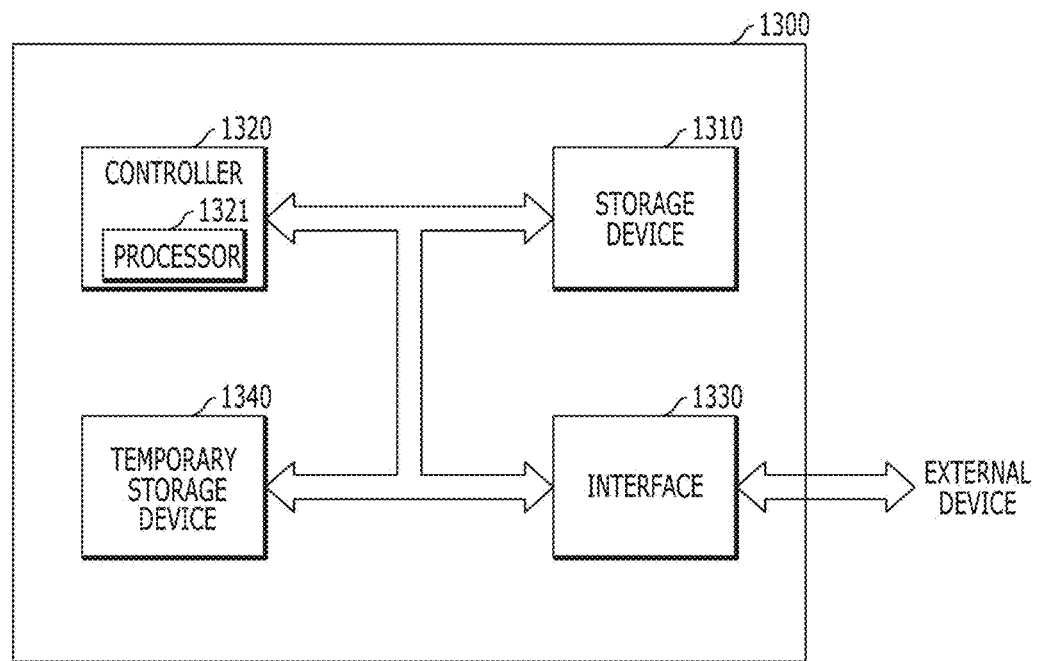
FIG. 14 is an example configuration diagram of a data storage system including memory circuitry based on an implementation of the disclosed technology.

FIG. 14 is an example configuration diagram of a data storage system including memory circuitry based on an implementation of the disclosed technology.

Referring to FIG. 14, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices based on the implementations. The temporary storage device 1340 may include a multilayer synthetic antiferromagnetic (Multi SAF) structure including a first ferromagnetic layer, a second ferromagnetic layer, and a spacer layer interposed between the first ferromagnetic layer and the second ferromagnetic layer, wherein the spacer layer may include n non-magnetic layers and n−1 magnetic layers that are disposed such that each of the n non-magnetic layers and each of the n−1 magnetic layers are alternately stacked, wherein n indicates an odd number equal to or greater than 3, wherein the n−1 magnetic layers and n non-magnetic layers may be configured to effectuate an antiferromagnetic exchange coupling with at least one of the first ferromagnetic layer and the second ferromagnetic layer. Through this, data storage characteristics of the storage device 1310 or the temporary storage device 1340 may be improved. As a result, operating characteristics and data storage characteristics of the data storage system 1300 may be improved.

Figure 15:
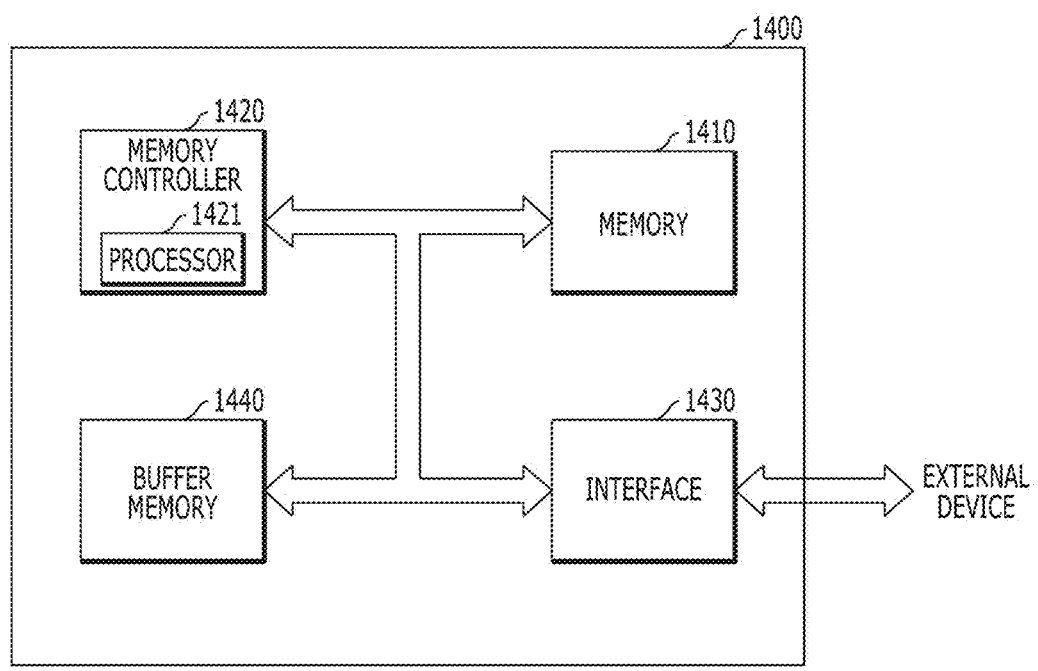
FIG. 15 is an example configuration diagram of a memory system including memory circuitry based on an implementation of the disclosed technology.

FIG. 15 is an example configuration diagram of a memory system including memory circuitry based on an implementation of the disclosed technology.

Referring to FIG. 15, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices based on the implementations. For example, the memory 1410 may include a multilayer synthetic anti-ferromagnetic (Multi SAF) structure including a first ferromagnetic layer, a second ferromagnetic layer, and a spacer layer interposed between the first ferromagnetic layer and the second ferromagnetic layer, wherein the spacer layer may include n non-magnetic layers and n−1 magnetic layers that are disposed such that each of the n non-magnetic layers and each of the n−1 magnetic layers are alternately stacked, wherein n indicates an odd number equal to or greater than 3, wherein the n−1 magnetic layers and n non-magnetic layers may be configured to effectuate an antiferromagnetic exchange coupling with at least one of the first ferromagnetic layer and the second ferromagnetic layer. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices based on the implementations. The buffer memory 1440 may include a multilayer synthetic anti-ferromagnetic (Multi SAF) structure including a first ferromagnetic layer, a second ferromagnetic layer, and a spacer layer interposed between the first ferromagnetic layer and the second ferromagnetic layer, wherein the spacer layer may include n non-magnetic layers and n−1 magnetic layers that are disposed such that each of the n non-magnetic layers and each of the n−1 magnetic layers are alternately stacked, wherein n indicates an odd number equal to or greater than 3, wherein the n−1 magnetic layers and n non-magnetic layers may be configured to effectuate an antiferromagnetic exchange coupling with at least one of the first ferromagnetic layer and the second ferromagnetic layer. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 11-15 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory includes:
a multilayer synthetic anti-ferromagnetic structure including a first ferromagnetic layer, a second ferromagnetic layer, and a spacer layer interposed between the first ferromagnetic layer and the second ferromagnetic layer,
wherein the spacer layer includes n non-magnetic layers and n−1 magnetic layers that are disposed such that each of the n non-magnetic layers and each of the n−1 magnetic layers are alternately stacked, wherein n indicates an odd number equal to or greater than 3,
wherein the first ferromagnetic layer, the second ferromagnetic layer, and the n−1 magnetic layers form an antiferromagnetic exchange coupling through the n non-magnetic layers.

2. The electronic device of claim 1, wherein at least one of the n non-magnetic layers has a face centered cubic (fcc) (111) structure.

3. The electronic device of claim 1, wherein at least one of the n non-magnetic layers includes Ru, Ir, or Cr or a combination thereof.

4. The electronic device of claim 1, wherein at least one of the n−1 magnetic layers has a face centered cubic (fcc) (111) structure.

5. The electronic device of claim 1, wherein the first ferromagnetic layer and the second ferromagnetic layer have fixed magnetization directions that are anti-parallel to each other.

6. The electronic device of claim 1, wherein the first ferromagnetic layer and the second ferromagnetic layer include a single-layer or multilayer structure including a ferromagnetic material.

7. The electronic device of claim 1, wherein the first ferromagnetic layer includes a pinned layer having a pinned magnetization direction, and the second ferromagnetic layer includes a shift canceling layer structured to offset or reduce a stray magnetic field generated by the pinned layer.

8. The electronic device of claim 1, further comprising an intermediate layer which is adjacent to the spacer layer and has a bcc (001) structure.

9. The electronic device of claim 8, wherein the intermediate layer includes Co, Fe, Ni, B, or a noble metal, or a combination thereof.

10. The electronic device of claim 1, further comprising a material layer which is interposed between the first ferromagnetic layer and the second ferromagnetic layer and structured to resolve lattice structure differences and a lattice constant mismatch between the first ferromagnetic layer and the second ferromagnetic layer.

11. The electronic device of claim 9, wherein at least one of the first ferromagnetic layer and the second ferromagnetic layer has a bcc (001) structure.

12. An electronic device comprising a semiconductor memory, wherein the semiconductor memory comprises:
a magnetic tunnel junction structure including a free layer, a pinned layer, and a tunnel barrier layer, the free layer having a variable magnetization direction, the pinned layer having a fixed magnetization direction, the tunnel barrier layer being interposed between the free layer and the pinned layer: and
an intermediate layer interposed between the tunnel barrier layer and the pinned layer,
wherein any one or more of the free layer and the pinned layer include a multilayer synthetic anti-ferromagnetic structure including a first ferromagnetic layer, a second ferromagnetic layer and a spacer layer interposed between the first ferromagnetic layer and the second magnetic layer,
wherein the spacer layer includes n non-magnetic layers and n−1 magnetic layers that are alternately stacked, wherein n indicates an odd number equal to or greater than 3,
wherein the first ferromagnetic layer, the second ferromagnetic layer and the n−1 magnetic layers form an antiferromagnetic exchange coupling through the n non-magnetic layers,
wherein the non-magnetic layers and the magnetic layers have a face centered cubic (fcc) (111) structure, and the intermediate layer has a bcc (001) structure.

13. The electronic device of claim 12, wherein at least one of the n non-magnetic layers includes Ru, Ir, Cr, or a combination thereof.

14. The electronic device of claim 12, wherein the intermediate layer includes Co, Fe, Ni, B, or a noble metal, or a combination thereof.

15. The electronic device of claim 12, wherein at least one of the first ferromagnetic layer and the second ferromagnetic layer has a bcc (001) structure.

16. The electronic device of claim 12, further comprising a material layer which is interposed between the first ferromagnetic layer and the second ferromagnetic layer and structured to resolve lattice structure differences and a lattice constant mismatch between the first ferromagnetic layer and the second ferromagnetic layer.

17. The electronic device of claim 1, wherein two of then non-magnetic layers are disposed as an uppermost layer and a lowermost layer in the spacer layer.

18. The electronic device of claim 17, wherein the two of the n non-magnetic layers are in contact with the first ferromagnetic layer and the second ferromagnetic layer, respectively.

19. The electronic device of claim 12, wherein two of then non-magnetic layers are disposed as an uppermost layer and a lowermost layer in the spacer layer.

20. The electronic device of claim 19, wherein the two of the n non-magnetic layers are in contact with the first ferromagnetic layer and the second ferromagnetic layer, respectively.

* * * * *